(12) United States Patent
Fudem et al.

(10) Patent No.: US 7,302,249 B1
(45) Date of Patent: Nov. 27, 2007

(54) HIGH DYNAMIC RANGE MIXER APPARATUS AND BALUN THEREFOR

(75) Inventors: Howard N. Fudem, Baltimore, MD (US); William E. Hall, New Windsor, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 518 days.

(21) Appl. No.: 11/016,837

(22) Filed: Dec. 21, 2004

(51) Int. Cl.
*H04B 1/26* (2006.01)

(52) U.S. Cl. .................... 455/327; 455/330; 333/26

(58) Field of Classification Search .............. None
See application file for complete search history.

(56) References Cited

U.S. PATENT DOCUMENTS

| | | | | |
|---|---|---|---|---|
| 5,280,647 | A * | 1/1994 | Arai et al. | 455/326 |
| 6,674,340 | B2 * | 1/2004 | Quan et al. | 333/164 |
| 7,095,998 | B2 * | 8/2006 | Tatsumi et al. | 455/330 |

* cited by examiner

*Primary Examiner*—Thanh Cong Le
(74) *Attorney, Agent, or Firm*—Andrews Kurth LLP

(57) ABSTRACT

A wide dynamic range mixer which has a high linearity passive balun fabricated on a Si substrate for receiving an input RF signal and an active balun for receiving a local oscillator signal. The active balun includes high frequency, low voltage SiGe transistors to achieve low power amplification of the local oscillator signal. The output signals of the baluns are provided to a non-linear diode quad mixer device which provides a desired IF signal.

11 Claims, 5 Drawing Sheets

HIGH DYNAMIC RANGE MIXER APPARATUS AND BALUN THEREFOR

STATEMENT OF GOVERNMENT INTEREST

This invention was made with Government support under Contract No. F33615-02-C-1181 awarded by the Defense Advanced Research Project Agency (DARPA). The Government has certain rights in this invention.

BACKGROUND OF THE INVENTION

1. Field of the Invention

The invention in general relates to electronic circuits, and more particularly to a high frequency microwave mixer with reduced noise and improved dynamic range.

2. Description of Related Art

A mixer is an electronic circuit which converts an input signal from one frequency to another. Basically, this is accomplished by combining, for example, an RF input signal with the signal from a local oscillator in a non-linear device, one example of which is a diode quad. As a result of the process, various frequencies are generated, including sum and difference frequencies. The difference frequency may be selected as the intermediate frequency (IF) for further processing.

In order to convert a wide range of input RF signals, from a maximum to a minimum, the mixer must have a wide dynamic range. Often this is accomplished by increasing the power or drive level of the local oscillator. Fabricating the mixer as an integrated circuit on a Si (silicon) chip requires that the local oscillator power be objectionably large. The present invention uses SiGe (silicon germanium) technology to provide a high frequency integrated circuit mixer having a wide dynamic range with relatively low power consumption. In addition, high linearity is achieved with a novel passive RF balun fabricated on the silicon chip.

SUMMARY OF THE INVENTION

An integrated circuit mixer is provided which has elements formed on a silicon substrate, and which elements comprise: a non-linear circuit device for mixing signals and a passive balun comprised of a) a first insulating layer on the silicon substrate, b) a ground plane on the first insulating layer, c) a second insulating layer on the ground plane, d) a first microstrip line on the second insulating layer and having a predetermined shape, e) a third insulating layer on the first microstrip line, f) a second microstrip line on the third insulating layer and being generally coextensive with the first microstrip line, with the second microstrip line having a first section of a first width and a second section of reduced width. The passive balun has an input port for receiving an RF signal, and first and second output ports connected to the non-linear circuit.

The mixer additionally includes a local oscillator balun having an input port for receiving a local oscillator signal, and first and second output ports connected to the non-linear device. An output port is connected to the non-linear device for delivering an IF signal as a result of the mixing of the RF and the local oscillator signals. The balun arrangement, per se, may be used with a variety of circuits.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
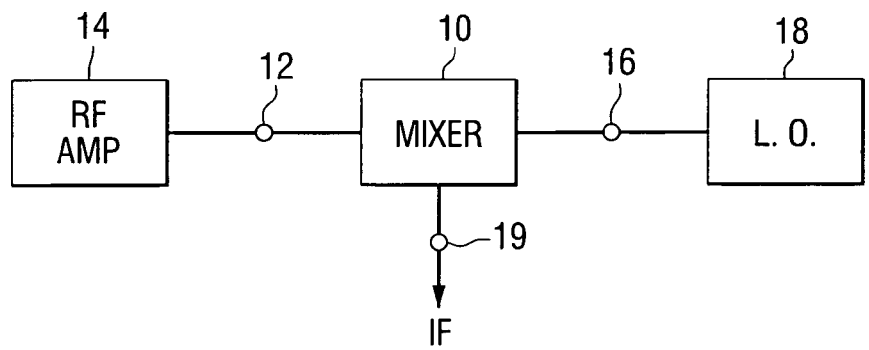
FIG. 1 is a block diagram of a mixer arrangement.

In FIG. 1, mixer 10 includes an RF input 12 for receiving an RF signal from a circuit, such as RF amplifier 14. Mixer 10 also includes a second input 16 to which is applied an output signal of a local oscillator 18. These signals are mixed by a non-linear process known as heterodyning, resulting in a plurality of generated signals, among which is, after suitable filtering, a desired IF signal having a frequency which is the difference between the local oscillator frequency and the RF signal frequency, and which is provided at port 19.

Figure 2:
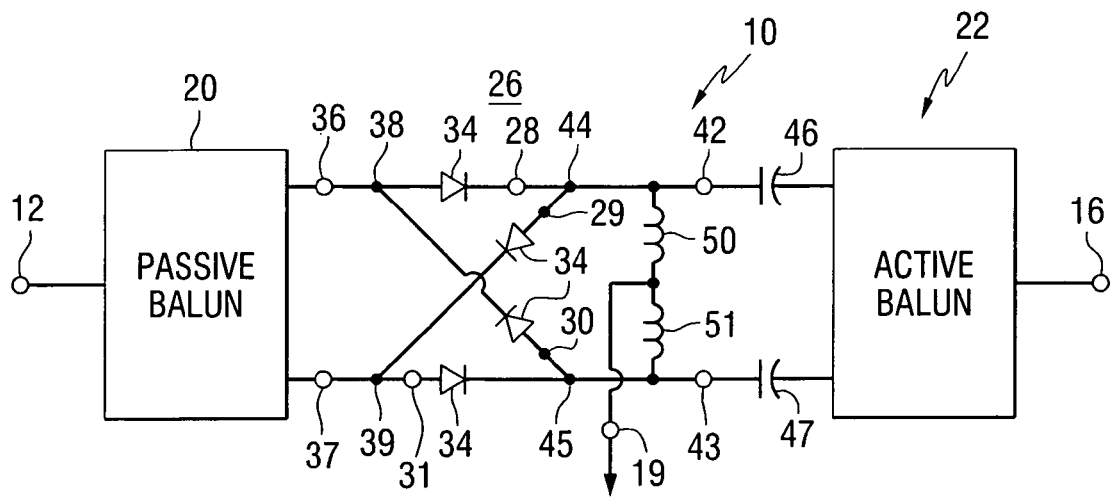
FIG. 2 is a more detailed presentation of the mixer portion of the arrangement of FIG. 1.

Mixer 10 is a double balanced mixer fabricated by conventional monolithic microwave integrated circuit (MMIC) techniques and, as illustrated in FIG. 2, includes first and second baluns 20 and 22. As will be described, balun 20 is a passive balun so as to provide high linearity, and balun 22 is an active balun so as to provide low power amplification of the local oscillator signal applied at input 16. Basically a balun is an impedance matching device which is operable to receive an input signal (the unbalanced signal) and provide first and second output signals (the balanced signal) which are equal in amplitude and 180° out of phase. Conversely, the balun can provide an unbalanced output signal in response to an input balanced signal. In the present arrangement, the balun performs the first-mentioned function.

Mixer 10 includes a non-linear device shown by way of example as a passive diode quad 26, having arms 28-31, with each arm having one or more diodes 34. Output ports 36 and 37 of balun 20 are respectively connected to junction points 38 and 39 of diode quad 26, while output ports 42 and 43 of balun 22 are connected to junction points 44 and 45. The output of balun 22 also includes capacitors 46 and 47, serving as feedback and DC blocking capacitors. Port 19, from which the IF signal is derived, is connected to the junction between two inductors 50 and 51 connected across the output ports 42 and 43 of balun 22.

Figure 3:
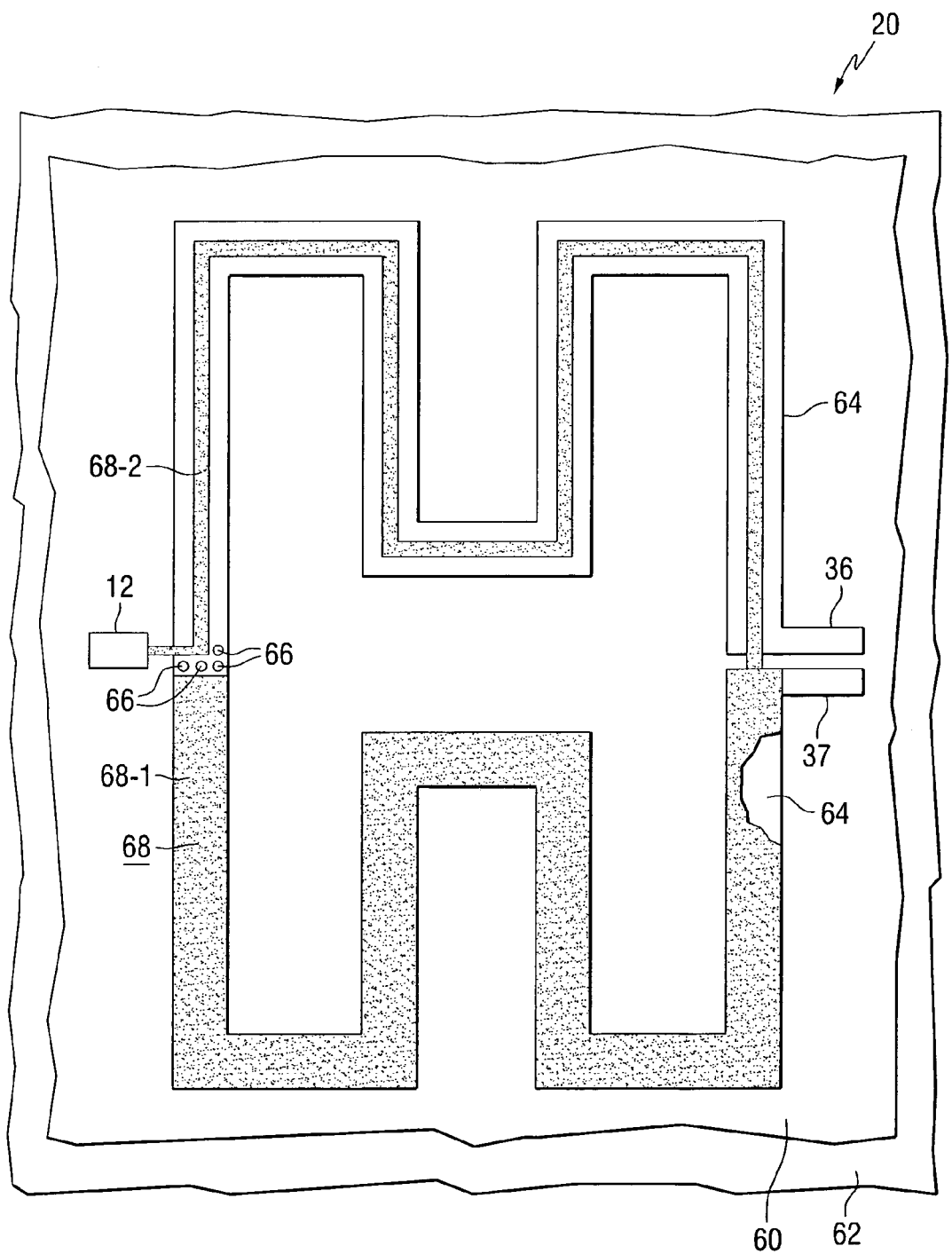
FIG. 3 is a plan view of a novel balun used herein.
Figure 4:
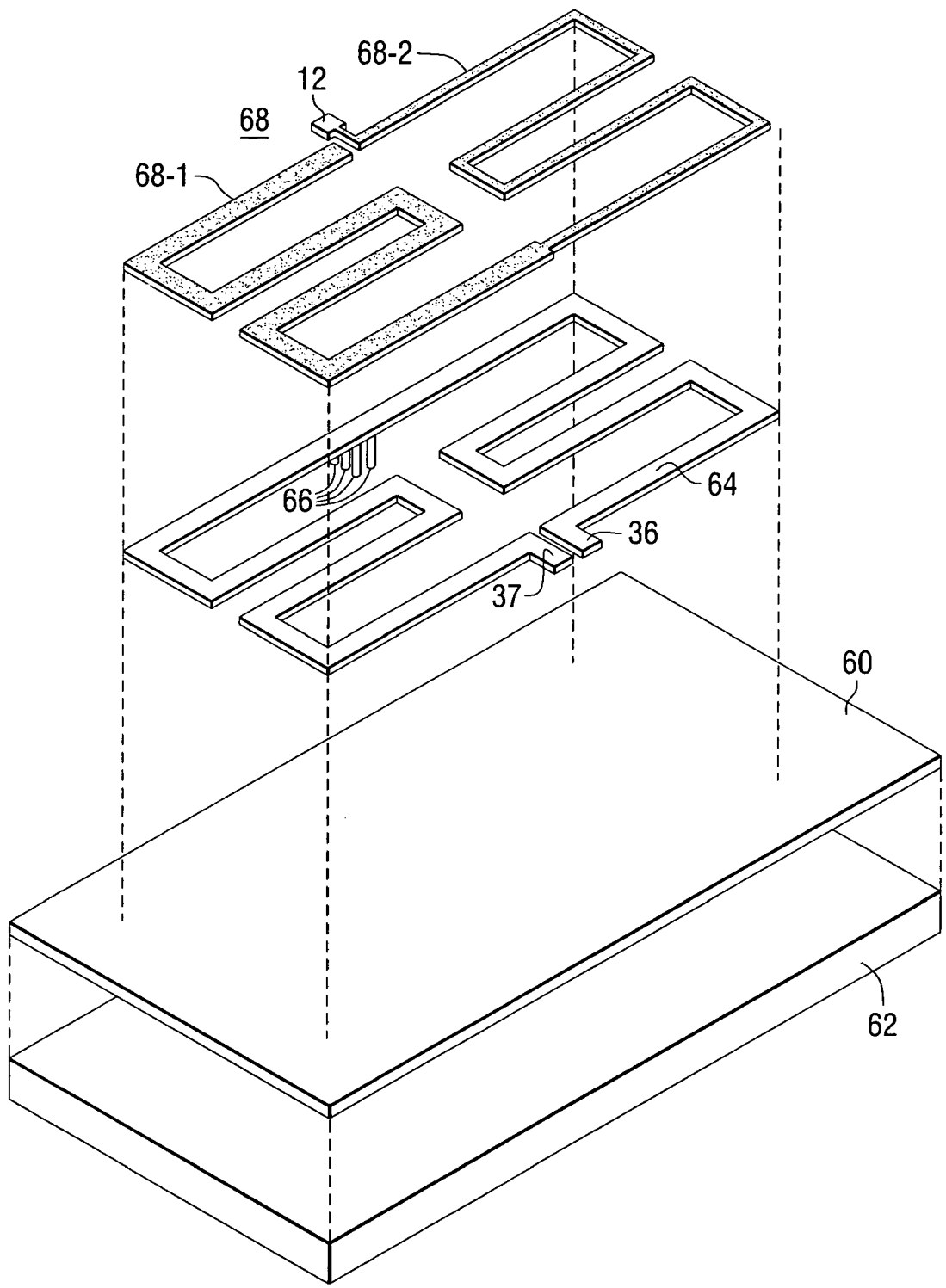
FIG. 4 is an exploded view of the balun of FIG. 3.
Figure 5:
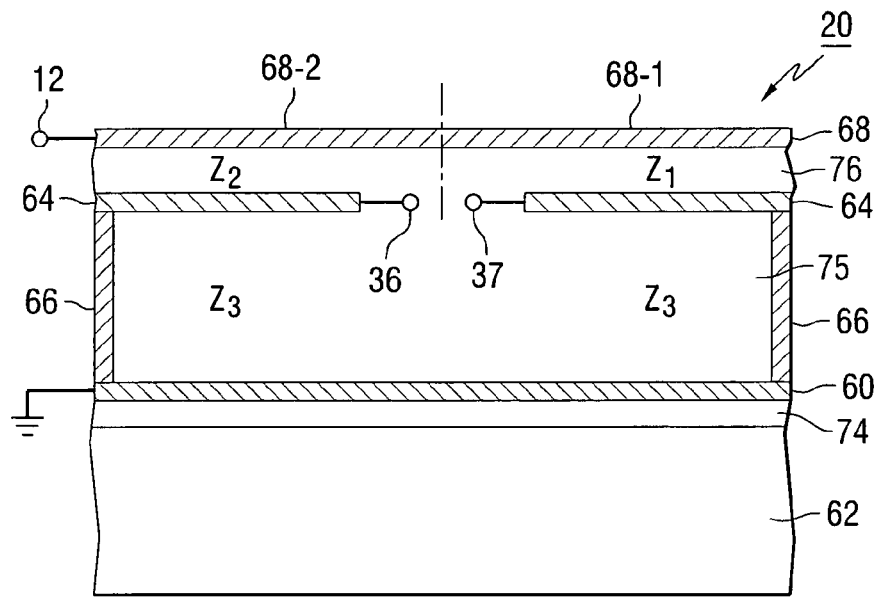
FIG. 5 is a transmission line representation of the balun of FIG. 3.

An embodiment of a novel balun, passive balun 20, which is fabricated by integrated circuit techniques, is illustrated in FIGS. 3 to 5. As best seen in the plan view of FIG. 3 and the exploded view of FIG. 4, balun 20 is comprised of microstrip lines in different layers, separated by dielectric layers (which for clarity are not illustrated in FIGS. 3 and 4). More particularly, balun 20 includes a ground plane 60 disposed on a dielectric layer deposited on silicon substrate 62.

The next metallization layer consists of microstrip line 64, of generally serpentine shape disposed above ground plane 60 and including output ports 36 and 37. Microstrip line 64 is connected to ground by a series of metalized vias 66. The width of the microstrip line 64 is uniform throughout the entire serpentine shape.

The top metallization layer consists of microstrip line 68 (shown stippled) which is divided into two sections, 68-1 and 68-2 which generally follow the serpentine shape of microstrip line 64. Section 68-1, however, has a first width which may be of the same width as microstrip line 64 beneath it, while section 68-2 has a second, and smaller width. These two different widths of sections 68-1 and 68-2 define two different impedances with respect to microstrip line 64. The input RF signal is applied to input port 12, connected to section 68-2.

A transmission line representation of the balun 20 is illustrated in FIG. 5. Ground plane 60 is deposited on a thin first dielectric layer 74, such as $SiO_2$ (silicon dioxide) covering the Si substrate 62. The next metallization, microstrip line 64 is separated from ground plane 60 by a second dielectric layer 75 and is electrically connected to the ground plane by metalized vias 66. The balanced output signal is provided at output ports 36 and 37. The top metallization, microstrip line 68 is separated from microstrip line 64 by a third dielectric layer 76 and receives the RF signal at input port 12. An impedance $Z_1$ is defined between microstrip line 64 and first section 68-1 of microstrip line 68, while a different impedance $Z_2$ is defined between microstrip line 64 and reduced width second section 68-2 of microstrip line 68. Since microstrip line 64 is of uniform width an impedance $Z_3$ is defined between it and ground plane 60. The arrangement of transmission lines to form the balun 20 is done in a way that eliminates any coupling to the Si substrate below the ground plane 60. This allows the formation of a balun which can work at high microwave frequencies without any coupling losses.

Figure 6:
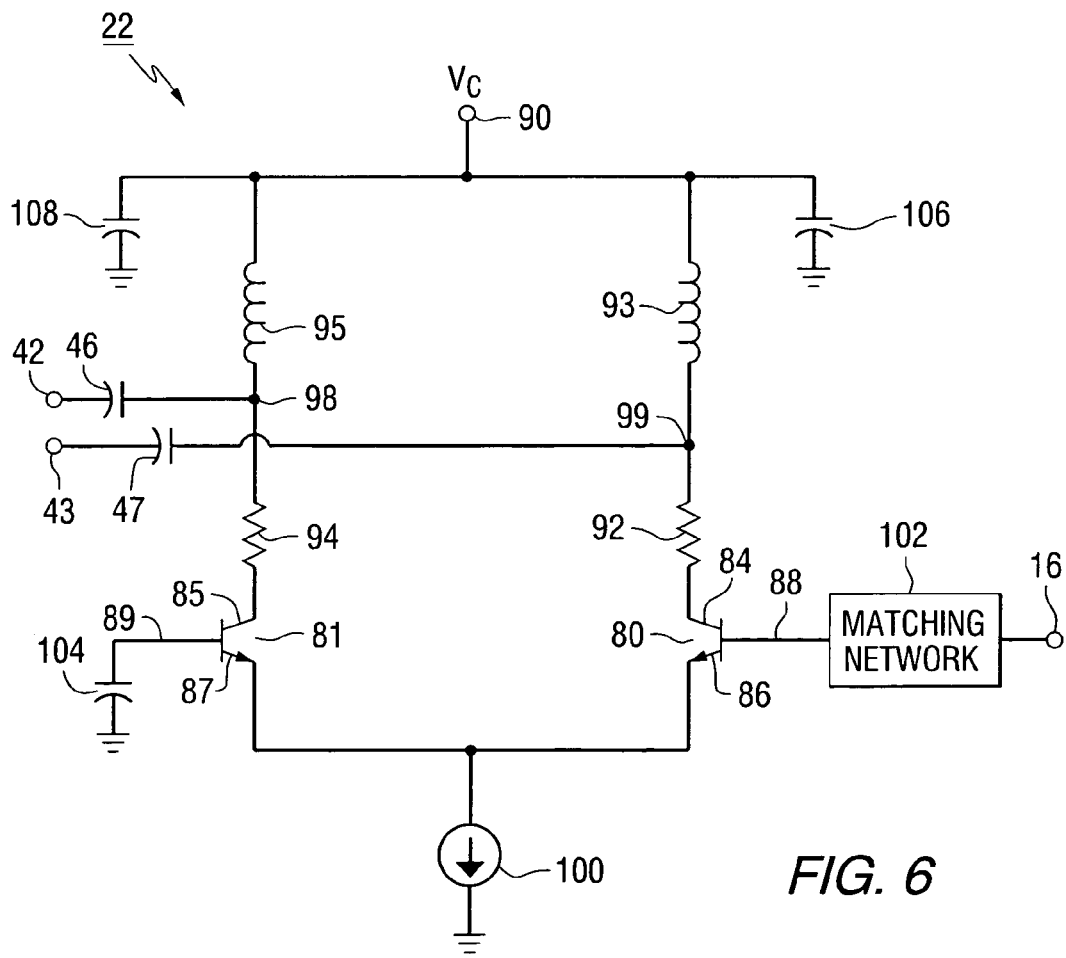
FIG. 6 is a diagram of an active balun used herein.

FIG. 6 illustrates an embodiment of an active balun 22 which may be used in the mixer arrangement. The active balun 22 is used on the local oscillator 16 port since a high drive level is required and the active balun supplies gain as opposed to a passive balun described above which has insertion loss. Having a SiGe amplifier in the local oscillator port will not adversely affect the mixer linearity which will be determined by the RF port response, and the nonlinear mixing elements (diodes in the present example). Balun 22 is a single ended differential amplifier which includes first and second SiGe transistors 80 and 81. That is, the transistors include respective n-type Si collectors 84 and 85, as well as n-type Si emitters 86 and 87. The respective bases 88 and 89 are of p-type SiGe. The SiGe transistors 80 and 81 operate at extremely high frequencies and at a relatively low operating voltage $V_c$, applied at terminal 90.

Collector 84 is connected to terminal 90 via resistor 92 and inductor 93, while collector 85 is connected to terminal 90 via resistor 94 and inductor 95. The output ports 42 and 43 are respectively connected to junction points 98 and 99 via coupling capacitors 46 and 47.

Emitters 86 and 87 of transistors 80 and 81 are connected to current source 100 which provides an infinite impedance to RF current and a path to ground for DC. An input local oscillator signal at input port 16 is applied to the base 88 of transistor 80 via an impedance matching network 102, with the base 89 of transistor 81 being grounded through capacitor 104. Capacitors 106 and 108 serve as an RF path to ground to decouple the power supply from RF. The use of SiGe transistors ensures that the mixer will not only operate at extremely high frequencies but that the local oscillator output will be sufficiently amplified with minimum expended power, to ensure for wide dynamic range operation of the mixer.

Figure 7:
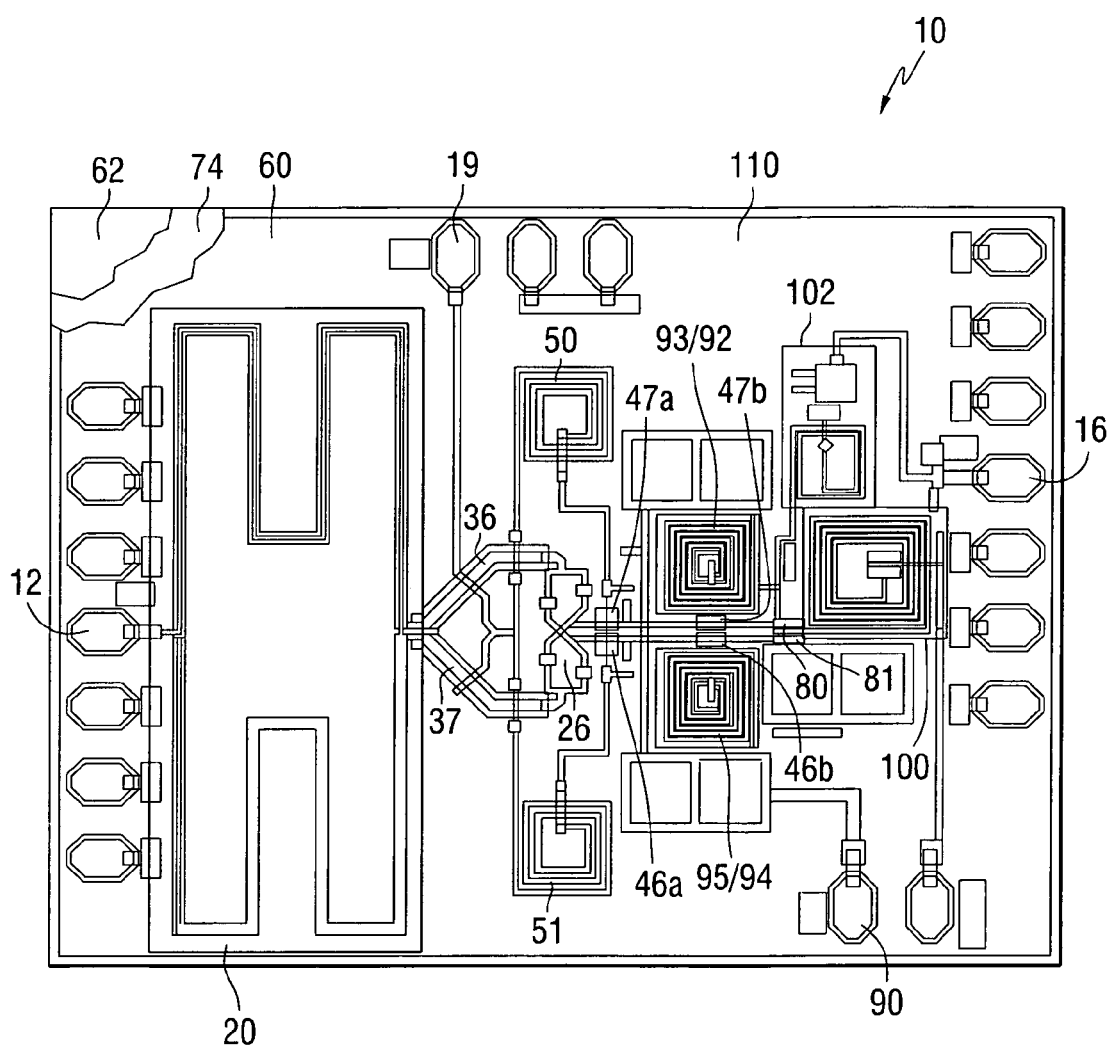
FIG. 7 is a plan view of an integrated circuit chip on which the mixer is formed.

FIG. 7 is a plan view of an integrated circuit chip 110 which incorporates the mixer elements previously described. A portion of the surface shown, which is the ground plane 60, is broken away so as to view the first dielectric layer 74 and Si substrate 62. For compactness, on the chip layout, capacitors 46 and 47 have each been deposited in two portions, 46a and 46b, and 47a and 47b. In addition, resistors 92 and 94 are incorporated in the square spiral inductors 93 and 95.

By utilizing the SiGe technology, the mixer 10 may be fabricated on an integrated circuit chip which additionally includes other SiGe circuitry such as low noise amplifiers, analog to digital converters, as well as other signal processing circuits. In this manner the preponderance of an entire system may be fabricated on a single chip.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. An integrated circuit mixer having elements formed on a silicon substrate, and which elements comprise:
   a non-linear circuit device for mixing signals;
   a passive balun comprised of a) a first insulating layer on said silicon substrate, b) a ground plane on said first insulating layer, c) a second insulating layer on said ground plane, d) a first microstrip line on said second insulating layer and having a predetermined shape, e) a third insulating layer on said first microstrip line, f) a second microstrip line on said third insulating layer and being generally coextensive with said first microstrip line, said second microstrip line having a first section of a first width and a second section of reduced width;
   said passive balun having an input port for receiving an RF signal, and first and second output ports;
   a local oscillator balun having an input port for receiving a local oscillator signal, and first and second output ports;
   said first and second output ports of said passive balun being connected to said non-linear device;
   said first and second output ports of said local oscillator balun being connected to said non-linear device;
   an output port connected to said non-linear device for delivering an IF signal as a result of the mixing of said RF and said local oscillator signals.

2. A mixer according to claim 1 wherein:
   the width of said first section of said second microstrip line is equal to the width of said first microstrip line.

3. A mixer according to claim 1 wherein:
   said first and second microstrip lines are of a serpentine shape.

4. A mixer according to claim 1 wherein:
   said non-linear circuit device is a passive diode quad.

5. A mixer according to claim 4 wherein:
   said local oscillator balun is an active balun.

6. A mixer according to claim 5 wherein said active balun includes:
   first and second transistors, each having a collector, base and emitter;

said collectors being connected to a source of potential;
said emitters being connected together;
said connected emitters being connected to ground via a current source which provides an infinite impedance to RF and a path to ground for DC;
said base of said first transistor being connected to said input port for receiving a local oscillator signal;
said base of said second transistor being connected to ground;
said first and second output ports of said local oscillator balun being respectively connected to said collectors of said first and second transistors.

7. A mixer according to claim 6 which includes;
an impedance matching network connected between said input port for receiving a local oscillator signal and said base of said first transistor.

8. A mixer according to claim 6 wherein:
said collectors of said first and second transistors are of silicon;
said bases of said first and second transistors are of silicon germanium; and
said emitters of said first and second transistors are of silicon.

9. A passive balun fabricated on a silicon substrate, comprising:
a first insulating layer on said silicon substrate;
a ground plane on said first insulating layer;
a second insulating layer on said ground plane;
a first microstrip line on said second insulating layer and having a predetermined shape;
a third insulating layer on said first microstrip line;
a second microstrip line on said third insulating layer and being generally coextensive with said first microstrip line, said second microstrip line having a first section of a first width and a second section of reduced width;
said passive balun having an input port for receiving an RF signal, and first and second output ports.

10. A passive balun according to claim 9 wherein:
the width of said first section of said second microstrip line is equal to the width of said first microstrip line.

11. A balun according to claim 10 wherein:
said first and second microstrip lines are of a serpentine shape.

* * * * *